US006853267B2

(12) United States Patent
Chiba et al.

(10) Patent No.: US 6,853,267 B2
(45) Date of Patent: Feb. 8, 2005

(54) NOISE FILTER AND ELECTRONIC APPARATUS COMPRISING THIS NOISE FILTER

(75) Inventors: Hironobu Chiba, Hyogo (JP); Kazuo Oishi, Osaka (JP); Eiichi Uriu, Osaka (JP); Takeshi Orita, Osaka (JP); Shogo Nakayama, Miyazaki (JP); Kazutoshi Matsumura, Hyogo (JP); Hironori Motomitsu, Osaka (JP); Atsushi Shinkai, Osaka (JP); Tomoyuki Washizaki, Miyazaki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 6 days.

(21) Appl. No.: 10/466,097

(22) PCT Filed: Jan. 11, 2002

(86) PCT No.: PCT/JP02/00135

§ 371 (c)(1),
(2), (4) Date: Jul. 10, 2003

(87) PCT Pub. No.: WO02/056322

PCT Pub. Date: Jul. 18, 2002

(65) Prior Publication Data

US 2004/0130415 A1 Jul. 8, 2004

(30) Foreign Application Priority Data

Jan. 15, 2001 (JP) ....................................... 2001-006028
Jul. 12, 2001 (JP) ....................................... 2001-211835

(51) Int. Cl.[7] ............................. H03H 7/01; H03H 7/09
(52) U.S. Cl. ......................... 333/185; 333/181; 336/200
(58) Field of Search ................................. 333/181, 184, 333/185, 177; 336/182, 200

(56) References Cited

U.S. PATENT DOCUMENTS

| | | | | |
|---|---|---|---|---|
| 5,111,169 A | * | 5/1992 | Ikeda | 333/181 |
| 5,431,987 A | * | 7/1995 | Ikeda | 428/209 |
| 6,384,705 B1 | * | 5/2002 | Huang et al. | 336/200 |
| 6,438,000 B1 | * | 8/2002 | Okamoto et al. | 363/40 |

FOREIGN PATENT DOCUMENTS

| | | |
|---|---|---|
| JP | 03-211810 A | 9/1991 |
| JP | 03-215917 A | 9/1991 |
| JP | 05-101950 | 4/1993 |
| JP | 06-077022 A | 3/1994 |
| JP | 07-290638 A | 11/1995 |
| JP | 10-013180 A | 1/1998 |
| JP | 10-200357 A | 7/1998 |
| JP | 2000-235919 A | 8/2000 |

OTHER PUBLICATIONS

Japanese International Search Report for PCT/JP02/00135, dated Apr. 2, 2002.

* cited by examiner

*Primary Examiner*—Robert Pascal
*Assistant Examiner*—Dean Takaoka
(74) *Attorney, Agent, or Firm*—RatnerPrestia

(57) ABSTRACT

In a noise filter having a large impedance in a common mode, a first conductor and a second conductor provided on first magnetic sheets and have spiral shapes of plural turns and spaced from each other for avoiding short-circuit. The first conductor is provided inside the spiral shape of the second conductor. The other end of the first inner conductor is located adjacent to the other end of the second inner conductor. The respective other ends of the first inner conductor and the second inner conductor on the magnetic sheet are connected at the respective other ends to first and second conductors provided on another magnetic sheet.

23 Claims, 14 Drawing Sheets

NOISE FILTER AND ELECTRONIC APPARATUS COMPRISING THIS NOISE FILTER

This application is a U.S. NATIONAL PHASE APPLICATION OF PCT INTERNATIONAL APPLICATION PCT/JP02/00135.

TECHNICAL FIELD

The present invention relates to a noise filter and an electronic device using the filter for a use in a mobile telephone and a data apparatus for suppressing noise components.

BACKGROUND ART

FIGS. 13A to 13G are plan views of a multi-layer transformer which functions as a conventional noise filter disclosed in Japanese Patent Laid-open Publication No.60-257709. The transformer includes magnetic sheets 1, first coil patterns 2, and second coil patterns 3. The first coil patterns 2 and 3 the second coil patterns 3 provided on each magnetic sheet 1 are arranged parallel to each other and have spiral shapes of 0.25 to 0.75 turn from an upper point of view.

As shown in FIGS. 13B to 13F, the magnetic sheets 1 are stacked, and the first coil patterns 2 are connected to one another to form a first coil 4. The second coil patterns 3 are connected to one another to form a second coil 5. Via-electrodes 6 are provided at both end of each first coil pattern 2 on each magnetic sheet 1, and via-electrodes 7 are provided at both ends of each second coil pattern 3. The via-electrodes 6 and 7 on each magnetic sheet 1 is electrically connected with a through-hole 8 in a magnetic sheet 1 to its corresponding electrodes 6 and 7 on another magnetic sheet 1. Both ends of the first and second coils 4 and 5, i.e., the coil patterns 2 and 3 on the uppermost and lowermost sheets 1 are connected to lead electrodes 9*a* to 9*d*. The coil patterns 2 and 3 on the uppermost and lowermost sheets 1 have a spiral shape of 0.5 turn except their ends around to the lead electrodes 9*a* to 9*d*.

As shown in FIGS. 13A and 13G, magnetic sheets 1 are provided on the first coil 4 and the second coil 5.

The first coil 4, the second coil 5, and the magnetic sheets 1 are stacked together to provide a noise filter.

In the conventional noise filter, when a noise in a common mode is applied to the coils 4 and 5, currents flow in the coils in the same direction from an upper point of view. The filter has an impedance increase accordingly, thereby suppressing the noise in the common mode.

However, the conventional noise filter may hardly increase the impedance in the common mode up to a desired level for suppressing noise components. Since the first coil pattern 2 and the second coil pattern on each magnetic sheet 1 have the spiral shapes of 0.25 turn to 0.75 turn, the coil patterns influence each other are short. Accordingly, magnetic flux generated by the first coil 4 and the second coil 5 is too small to emphasize each other, and thus, the filter does not have a large impedance in the normal mode of the filter.

FIG. 14 is an exploded perspective view of another conventional noise filter disclosed in Japanese Patent Laid-Open Publication No.5-101950. The filter includes a coil assembly 101 made of magnetic sheets having large magnetic permeability and lead assemblies 102 and 103 made of magnetic sheets having small magnetic permeability. The lead assemblies 102 and 103 are provided on both, upper and lower, surfaces of the coil assembly 101. A first coil consists mainly of conductors 108*a* and 109*a* which are electrically connected to each other with a through-hole 106*a*. Similarly, a second coil consists mainly of conductors 108*b* and 109*b* which are electrically connected to each other with a through-hole 106*c*. The noise filter has a small impedance for a normal component at the lead assemblies, thus suppressing a common mode noise without seriously disturbing a signal.

The conventional noise filter suppresses the common mode noise by having a small impedance for the normal component throughout the coil. The noise filter further suppresses the common mode noise by having a large impedance for a common component in the coil assembly 101 including the sheets having the large magnetic permeability. In order to have the large impedance for the common component, the filter needs to include tens of coil patterns of less than one turn stacked. This structure increases a number of production steps including fabricating through-holes and printing coil patterns, and they are assembled complicatedly. Such an intricate structure of the noise filter often suffers from open faults and short-circuits, hence having a declining efficiency of its production.

SUMMARY OF THE INVENTION

A noise filter has a large impedance in a common mode and thus has a large noise attenuation in the common mode. The filter includes a magnetic body including first and second magnetic sheets, external electrodes provided on both side surfaces of the magnetic body, first and second inner conductors having spiral shapes of one or more turns and provided on the first magnetic sheet, third and fourth inner conductors having spiral shapes of one or more turns and provided on the second magnetic sheet, lead electrodes provided at one end of the first magnetic sheet for connecting a first end of the first inner conductor to one of the external electrodes and for connecting a first end of the second inner conductor to one of the external electrodes, respectively, and lead electrodes provided at one end of the second magnetic sheet for connecting a first end of the third inner conductor to one of the external electrodes and for connecting a first end of the fourth inner conductor to one of the external electrodes, respectively. The first and second inner conductors are not short-circuited from each other, and the third and fourth inner conductors are not short-circuited from each other. A second end of the first inner conductor is located near a second end of the second inner conductor, and a second end of the third inner conductor is located near a second end of the fourth inner conductor. The second end of the first inner conductor is electrically connected to the second end of the third inner conductor. The second end of the second inner conductor is electrically connected to the second end of the fourth inner conductor.

DETAILED DESCRIPTION OF THE PREFERRED EMBODIMENTS (Embodiment 1)

Figure 1A:
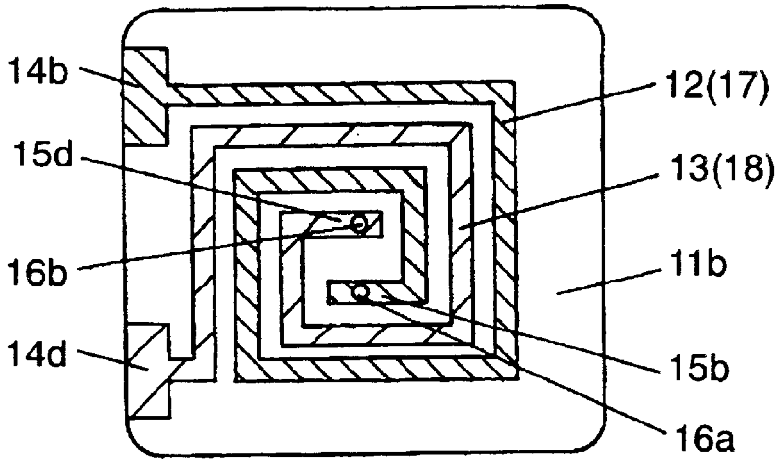
FIGS. 1A and 1B are plan views of a noise filter according to exemplary embodiment 1 of the present invention.
Figure 1B:
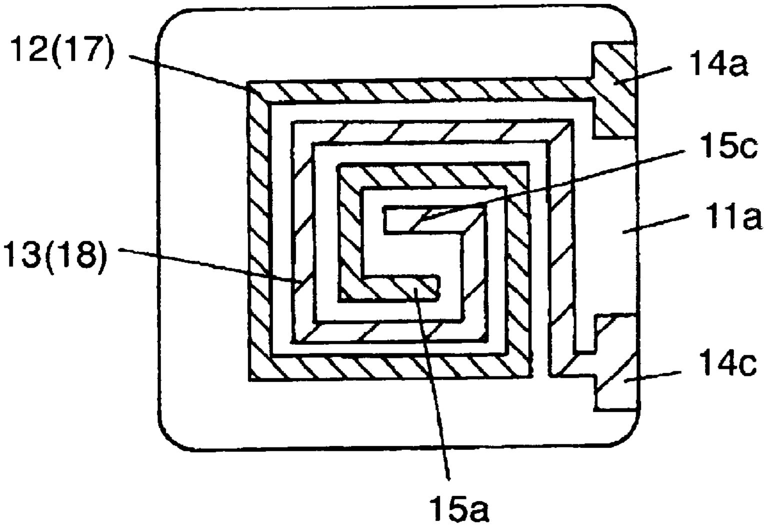
Figure 2:
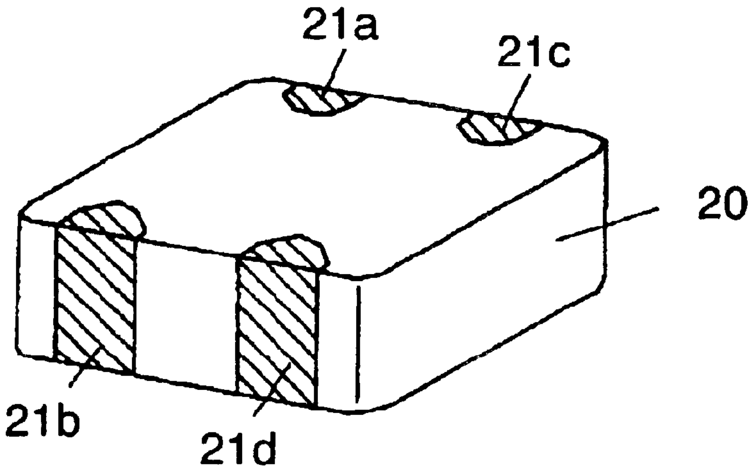
FIG. 2 is a perspective view of the noise filter of embodiment 1.

FIGS. 1A and 1B are plan views of a noise filter according to exemplary embodiment 1 of the present invention. FIG. 2 is a perspective view of the noise filter. First magnetic sheets 11*a* and 11*b* have a first inner conductor 12 and a second inner conductor 13 provided on the upper surface thereof, respectively. The first magnetic sheets 11*a* and 11*b* have lead electrodes 14*a* to 14*d* provided at one side thereof and via-electrodes 15*a* to 15*d* provided at central regions thereof. The first magnetic sheets 11*a* and 11*b* are made of magnetic material, such as ferrite.

The first inner conductor 12 and the second inner conductor 13 are made of electrically conductive material, such as silver, having a spiral shape of more than one turn, and spaced from each other for avoiding short-circuit. The inner conductors 12 and 13 are identical in the direction of the spiral from an upper point of view.

The first inner conductor 12 and the second inner conductor 13 have one ends connected to the lead electrodes 14*a* to 14*d* and the other ends, i.e., the center of the spiral connected to the via-electrodes 15*a* to 15*d*.

The first inner conductor 12 on the first magnetic sheet 11*a* is connected to the lead electrode 14*a*, while the second inner conductor 13 is connected to the lead electrode 14*c*. Similarly, the first inner conductor 12 on the other first magnetic sheet 11*b* is connected to the lead electrode 14*b*, while the second inner conductor 13 is connected to the lead electrode 14*d*. The lead electrodes 14*a* to 14*d* are made of electrically conductive material, such as silver.

The via-electrode 15*a* is provided on the first magnetic sheet 11*a* while the via-electrode 15*b* is provided on the other first magnetic sheet 11*b*. The via-electrodes 15*a* and 15*b* are connected to each other via a through-hole 16*a* provided in the first magnetic sheet 11*b*. Thus, the first inner conductors 12 on the sheets are connected to each other, providing a first coil 17.

Similarly, the via-electrode 15*c* is provided on the first magnetic sheet 11*a*, while the via-electrode 15*d* is provided on the other first magnetic sheet 11*b*. The via-electrodes 15*c* and 15*d* are connected to each other via a through-hole 16*b* provided in the first magnetic sheet 11*b*. Thus, the first inner conductors 13 on the sheets are connected to each other, providing a second coil 18.

The via-electrodes 15*a* and 15*c* are located close to but spaced from each other for avoiding short-circuit, and the via-electrodes 15*b* and 15*d* are located close to but spaced from each other for avoiding short-circuit.

The upper surface of the first magnetic sheet 11*b* on which the first inner conductor 12 and the second inner conductor 13 are provided and the lower surface of the first magnetic sheet 11*a* may be covered with dummy sheets 19 (not shown) if desired. Those sheets are stacked, thus providing a magnetic body 20.

The magnetic body 20 has external electrodes 21*a* and 21*c* provided on one side thereof. The external electrodes 21*a* and 21*c* are connected to the lead electrodes 14*a* and 14*c*, respectively. Similarly, the magnetic body 20 has external electrodes 21*b* and 21*d* provided on the opposite side thereof and connected to the lead electrodes 14*b* and 14*d*, respectively.

A procedure of fabricating the noise filter of embodiment 1 will be described.

FIGS. 3A to 3C and FIGS. 4A to 4D are perspective views for illustrating the procedure of fabricating the noise filter of embodiment 1.

First, the first magnetic sheets 11*a* and 11*b* having a square shape are prepared from mixture of oxide of ferrite powder and resin.

Figure 3A:
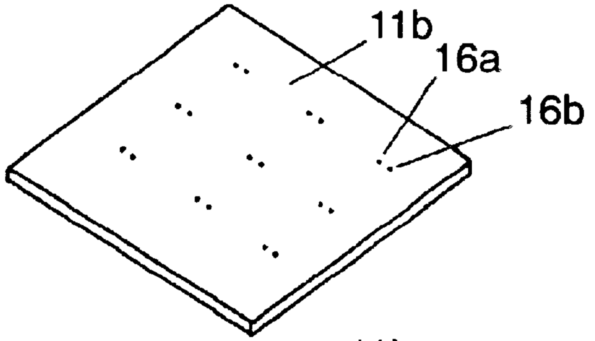
FIGS. 3A to 3C are perspective views of for illustrating a procedure of fabricating the noise filter of embodiment 1.

Then, as shown in FIG. 3A, the magnetic sheet 11*b* are perforated by laser or punching process to have the first and second, through-holes 16*a* and 16*b* at the center of each spiral corresponding to the respective other ends of the first inner conductor 12 and the second inner conductor 13. The first through-hole 16*a* and the second through-hole 16*b* are located near each other.

Figure 3B:
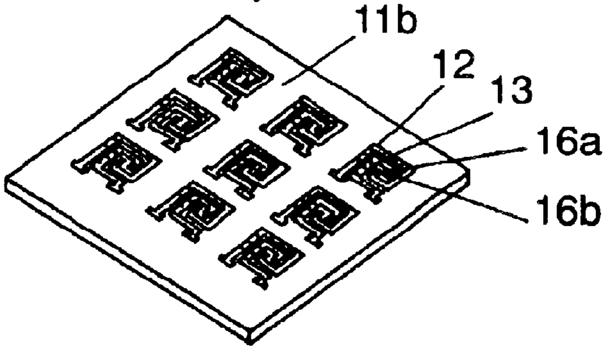

The first inner conductors 12 and the second inner conductors 13 having the spiral shape of more than one turn are provided by printing or plating on the first magnetic sheet 11*b* where the through-holes 16*a* and 16*b* are provided, as shown in FIG. 3B. In particular, the second inner conductor 13 is located at the inward side of the first inner conductor 12 for avoiding short-circuit. The via-electrodes 15*b* and 15*d* (not shown) are then provided at the respective other ends of the first and second inner conductors 12 and 13. As the other ends of the via-electrodes 15*b* and 15*d*. The electrodes 15*b* and 15*d* are connected to the through-holes 16*a* and 16*b*, respectively. The respective one ends of the first inner conductor 12 and the second inner conductor 13 are connected to the lead electrodes 14*b* and 14*d* (not shown).

The first through-hole 16*a* and the second through-hole 16*b* are filled with electrically conductive material, such as silver.

Similarly, the first inner conductors 12 and the second inner conductors 13 having a spiral shape of more than one turn are provided by printing or plating on the first magnetic sheet 11*a*.

Figure 3C:
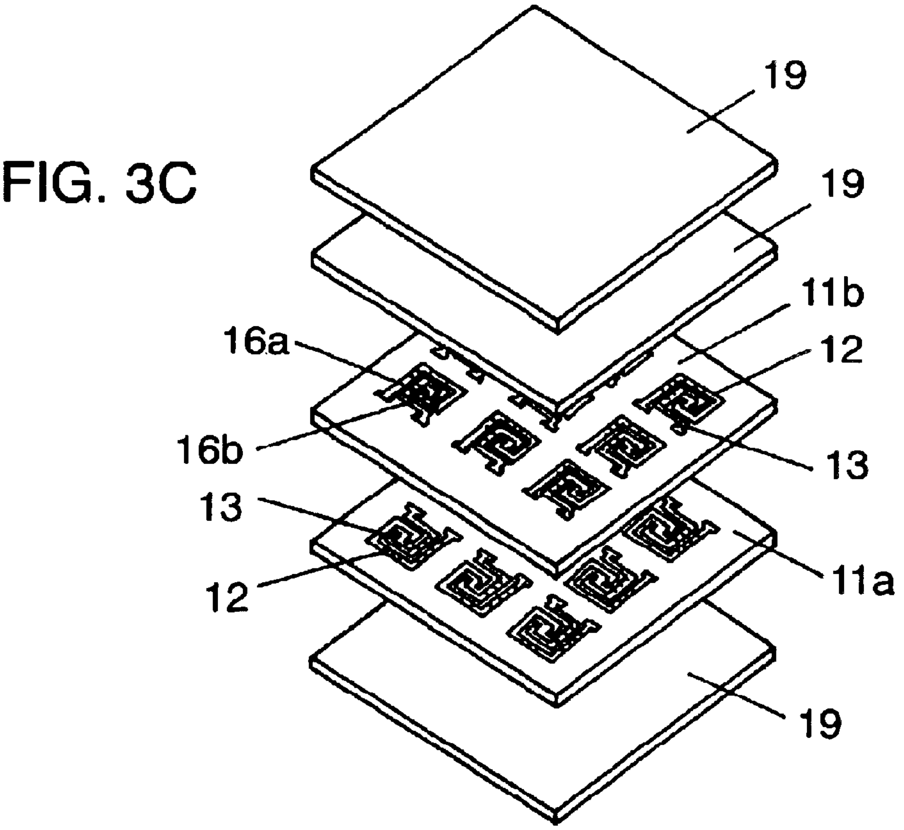

Then, the first magnetic sheet 11*b* is placed on the first magnetic sheet 11*a*, as shown in FIG. 3C. More specifically, a dummy magnetic sheet 19, the first magnetic sheet 11*a* having the first inner conductor 12 and the second inner conductor 13 provided thereon, the other first magnetic sheet 11*b* having the first inner conductor 12 and the second inner conductor 13 provided thereon, and another dummy magnetic sheet 19 are placed one over the other in this order. Respective upper surfaces of the first inner conductor 12 and the second inner conductor 13 provided on the first magnetic sheet 11*b* and the lower surface of the first magnetic sheet

11*a* may be covered with a desired number of the dummy magnetic sheets 19.

The first inner conductors 12 are electrically connected to each other via the first through-hole 16*a*, while the second inner conductors 13 are electrically connected to each other via the second through-hole 16*b*. Meanwhile, the inner conductors 12 and 13 and the lead electrodes 14*a* to 14*d* (not shown) may be fabricated by any process, such as printing, plating, vapor depositing, or sputtering.

Figure 4A:
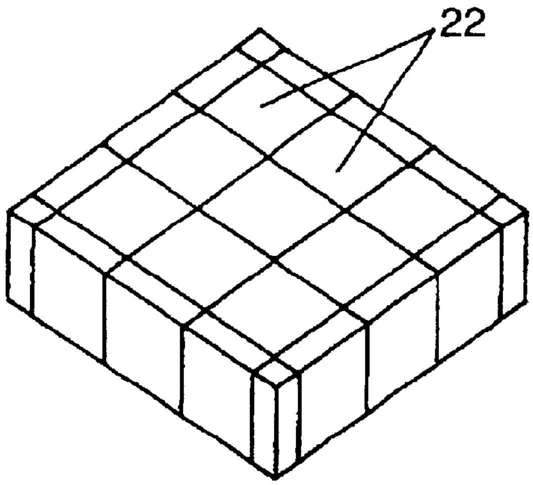
FIGS. 4A to 4D are perspective views for illustrating a procedure of fabricating the noise filter of embodiment 1.
Figure 4B:
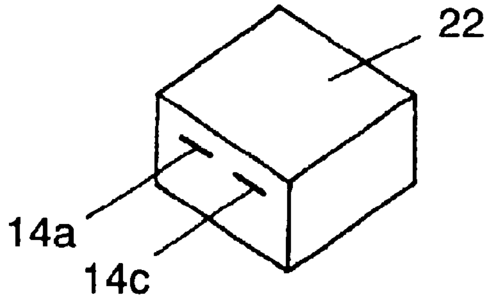

Then, the stacked assembly are divided into noise filter blocks 22 by dicing, as shown in FIG. 4A. Each block shown in FIG. 4B includes the first inner conductors 12 and the second inner conductors 13. The block 22 has the lead electrodes 14*a* and 14*c* exposed at one side and the lead electrodes 14*b* and 14*d* exposed at the opposite side.

The block 22 is then baked at a predetermined temperature for a predetermined period of time, thus providing the magnetic body 20.

Figure 4C:
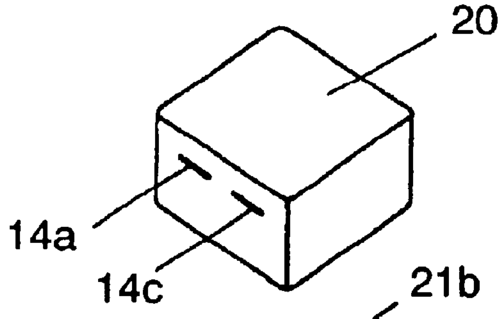
Figure 4D:
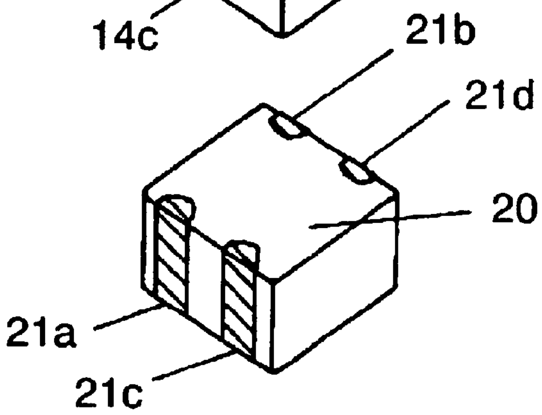

The magnetic body 20 is deburred by barrel processing, as shown in FIG. 4C.

Finally, the external electrodes 21*a* to 21*d* made of electrically conductive material, such as silver, are provided on the magnetic body 20 and connected to the lead electrodes 14*a* to 14*d*, respectively, thus providing the a noise filter.

The external electrodes 21*a* to 21*d* may be nickel-plated on the conductive, silver surface or finished with plating of low-melting point metal, such as tin or soldering alloy, over the nickel-plated surface.

Alternatively, prior to the nickel-plating over the conductive or silver surface, the magnetic body 20 may be immersed into fluoric silane coupling agent liquid under a vacuum atmosphere. This permits tiny pores in the magnetic body 20 to be filled with the volatile fluoric silane coupling agent, hence improving a resistance to moisture of the noise filter.

The noise filter of embodiment 1 allows the first conductor 12 and the second conductor 13 on the first magnetic sheets 11*a* and 11*b*, which affect each other, to be favorably lengthened. In addition, since plural first magnetic sheets 11*a* and 11*b*, each having the first inner conductor 12 and the second inner conductor 13, are provided in a stacked assembly, the total lengths of respective portions of the first inner conductors 12 and the second inner conductors 13 which influence each other can further increase. This increases the impedance for a noise in a common mode. As the result, the noise filter has a large attenuation of noise components in the common mode.

When currents flow in the first coil 17 and the second coil 18 in the same direction from an upper point of view, the first inner conductors 12 and 13 generate magnetic fluxes which emphasize each other throughout the magnetic body 20. As the result, the noise filter of embodiment 1 can have a larger impedance in the common mode than the conventional noise filter shown in FIG. 7. The currents flowing in the first coil 17 and the second coil 18 in the same direction increases the impedance of the first inner conductor 12 and the second inner conductor 13, thus attenuating the noise in the common mode.

Since having the spiral shapes of more than one turn, the first inner conductor 12 and the second inner conductor 13 have lengths greater than that of any conventional scroll or zigzag shape, hence increasing the impedance in the common mode.

Additionally, upon spaced from each other by a minimum distance for avoiding short-circuit, the first inner conductor 12 and the second inner conductor 13 generate magnetic fluxes emphasized by each other, hence increasing the impedance in the common mode.

Moreover, the number of the first magnetic sheets having the first inner conductor 12 and the second inner conductor 13 provided thereon is not limited to two. More than three of the first magnetic sheets further increase the impedance in the common mode.

In case that the second inner conductor 13 is not placed inside or outside the spiral shape of the first inner conductor 12, that is, is placed independently from each other, the distance between the conductors is not short although the conductors have the spiral shapes. Accordingly, magnetic fluxes generated by the conductors may not be emphasized by each other, hence hardly increasing the impedance in the common mode.

(Embodiment 2)

Figure 5A:
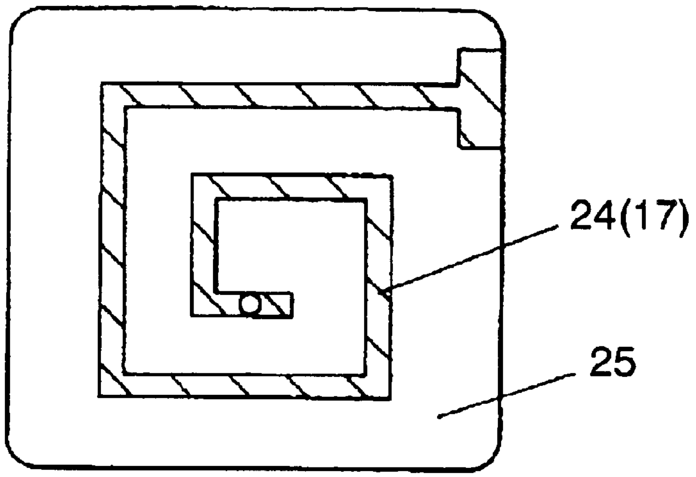
FIGS. 5A to 5C are plan view of a noise filter according to exemplary embodiment 2 of the invention.
Figure 5B:
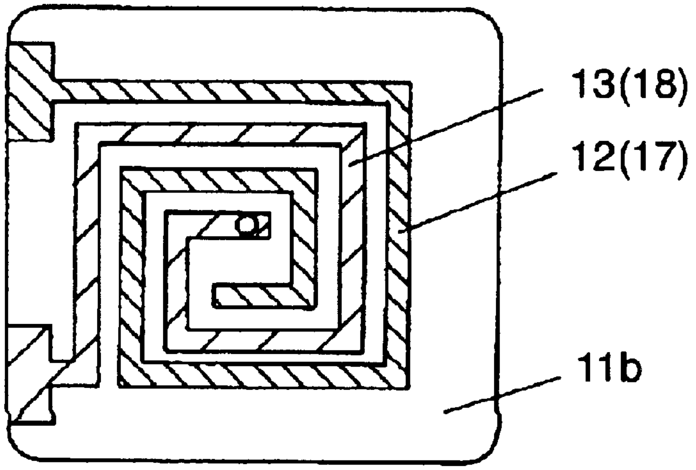
Figure 5C:
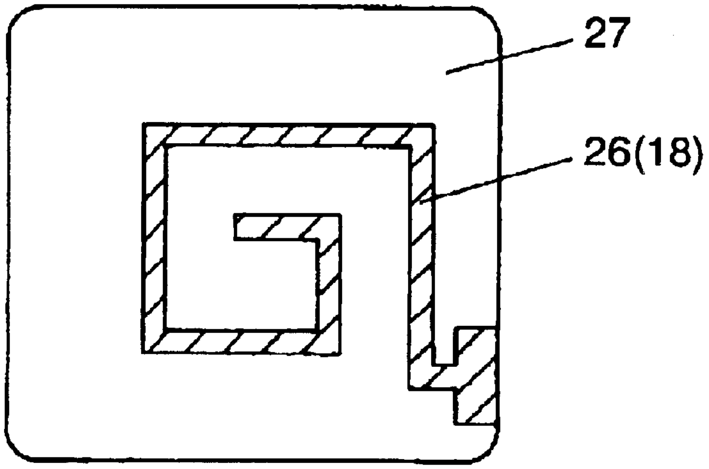

FIGS. 5A to 5C are plan views of a noise filter of embodiment 2 of the present invention. Like components are denote by like numerals as those of embodiment 1 and will be explained in no more detail.

As shown in FIGS. 5A to 5C, a first magnetic sheet 11*b* has a first inner conductor 12 and a second inner conductor 13 provided on the upper surface thereof. A second magnetic sheet 25 having a third inner conductor 24 connected to the first inner conductor 12 is provided on the upper surface of the first magnetic sheet 11*b*. A third magnetic sheet 27 having a fourth inner conductor 26 connected to the second inner conductor 13 is provided on the lower surface of the first magnetic sheet 11*b*. The fourth inner conductor 26 may be provided not on the third magnetic sheet 27 but on a dummy magnetic sheet 19.

This arrangement allows the third inner conductor 24 on the second magnetic sheet 25 and the fourth inner conductor 26 on the third magnetic sheet 27 to be spaced from each other by the first magnetic sheet 11*b* having the first inner conductor 12 and the second inner conductor 13 provided thereon. Therefore, even when currents flow in the first coil 17 and the second coil 18 in different directions, magnetic fluxes generated by the first coil 17 and the second coil 18 can hardly decrease each other. This increases an impedance in a normal mode.

When currents flowing in the first coil 17 and the second coil 18 in the same direction, the inner conductors 12 and 13 on the first magnetic sheet 11*b* has a large impedance in a common mode as explained in embodiment 1.

In other words, the noise filter shown in FIG. 5 has a large impedance both in the common mode and the normal mode.

The first coil 17 is composed mainly of the first inner conductor 12 and the third inner conductor 24, while the second coil 18 is composed mainly of the second inner conductor 13 and the fourth inner conductor 26. The third inner conductor 24 and the fourth inner conductor 26 have spiral shapes, such as screw or coaxial configuration. This shape generates a magnetic flux more than a linear shape, thus increasing the impedance in the normal mode.

The first coil 17 and the second coil 18 have the same length, i.e., the distance between the lead electrodes by appropriately adjusting the length of the third inner conductor 24 on the second magnetic sheet 25 and the length of the fourth inner conductor 26 on the third magnetic sheet 27. This adjustment allows the first coil 17 and the second coil 18 to have the same resistances and impedances.

Moreover, in case that the third inner conductor 24 and the fourth inner conductor 26 allows the first coil 17 and the second coil 18 to have the same resistances and impedances, a non-magnetic material is provided on at least one of the upper surface the third inner conductor 24 and the lower surface of the fourth inner conductor 26. This arrangement decreases the magnetic flux generated by the third inner conductor 24 and/or the fourth inner conductor 26. Accordingly, the impedance the third inner conductor 24 and/or the fourth inner conductor 26 become small in both the normal mode and the common mode. As the result, the impedances of the first inner conductor 12 and the second inner conductor 13 on the first magnetic sheet 11*b* can remain stable in both the normal mode and the common mode.

Nothing may be provided on the upper surface of the third inner conductor 24 and/or on the lower surface of the fourth inner conductor 26 as the non-magnetic material. However, the third inner conductor 24 and the fourth inner conductor 26 covered with the non-magnetic material, such as glass or resin, can have a large insulating performance and a large resistance against moisture.

Alternatively, the second magnetic sheet 25 having only the third inner conductor 24 provided thereon may be provided on respective lower surfaces of the first inner conductor 12 and the second inner conductor 13 provided on the first magnetic sheet 11*b*. The third magnetic sheet 27 having only the fourth inner conductor 26 may be provided on the respective upper surfaces of the first inner conductor 12 and the second inner conductor 13 provided on the first magnetic sheet 12.

Since the conventional noise filter shown in FIG. 13 has the first coil pattern 2 provided at an outer side of the second coil pattern 3, the first and second coils 4 and 5 cannot have the same resistances and impedances.

The number of the first magnetic sheet 11*b* the first inner conductor 12 and the second inner conductor 13 provided thereon is not limited to one but may be provided two or more.

The noise filter of embodiment 2, similarly to that of embodiment 1, can have the resistance against moisture, upon having the magnetic sheets impregnated with silane coupling agent.

A use of the noise filter of embodiments 1 and 2 of the present invention for a pair of signal lines of an electronic device, such as a mobile telephone or a radio transmitter, will be explained.

A lead line from a head set of a mobile telephone often includes a pair of signal lines, cables. In the lines, a high-frequency signal component of a carrier may often interfere a main signal in the same phase, thus acting as a radiant noise. Therefore, a high-frequency noise in a common mode is input in the signal lines. The main signal including a voice signal and a control signal for the mobile telephone are in a normal mode.

The main signal in the normal mode is interfered by the high-frequency noise in the common mode since the signal contains a low frequency component induced by a non-linear device and a static capacitance in a circuit.

Figure 6A:
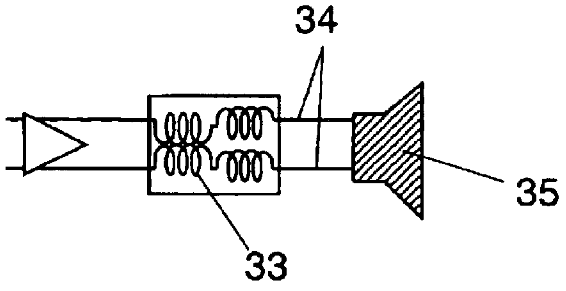
FIG. 6A illustrates a use of the noise filter of embodiment 1.
Figure 6B:
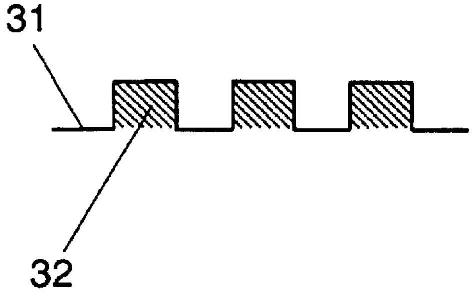
FIG. 6B shows a waveform of a carrier on a pair of signal lines of a mobile telephone.

FIG. 6A illustrates an application of the noise filter of embodiments 1 and 2. The noise filter 33 of the invention has the external electrodes 21*a* to 21*d* shown in FIG. 1 connected via the signal lines 34 of a head set coupled to a headphone 35. More specifically, the first coil 17 and the second coil 18 of the noise filter 33 are connected to the signal lines 34, respectively.

In case that a signal of a TDMA mobile telephone system includes a 217 Hz burst signal 32 carried on a (TDMA) carrier 31 at 900 MHz. The 217 Hz component is detected and may be superimposed on the voice signal in the normal mode, thus creating a audible noise. The noise can be attenuated by decreasing an amplitude of a common mode current induced in the normal mode.

Figure 6C:
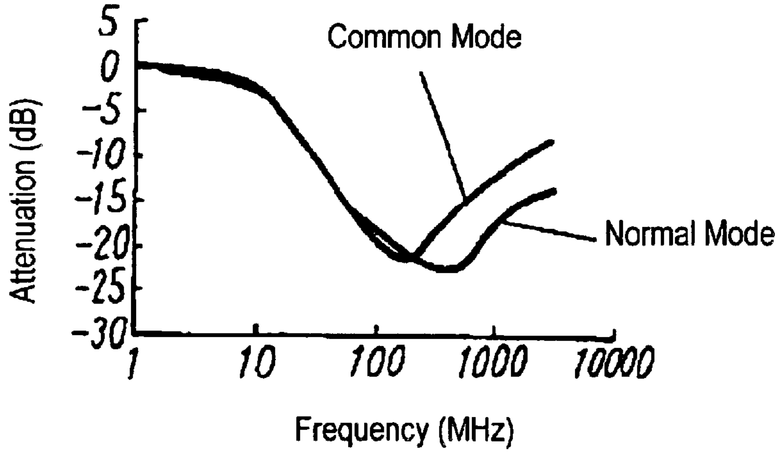
FIG. 6C illustrates the relationship between frequency and attenuation of the noise filter of embodiments 1 and 2 used as the pair of the signal lines.

FIG. 6C illustrates a filtering effect of the noise filter of embodiments 1 and 2, i.e., the relationship between frequency and attenuation. As shown in the figure, the noise in the common mode and the normal mode is attenuated at 900 MHz of the carrier. Accordingly, the 217 Hz component of the burst signal 32 on the carrier of 900 MHz which creates the audible noise can be eliminated.

Since the signal lines in radio communications device, such as a mobile telephone, are connected to the first coil 17 and the second coil 18 of the noise filter of embodiments 1 and 2, the filter has a large impedance in both the common mode and the normal mode, and thus attenuates a noise component in the normal mode. Accordingly, the audible noise on the signal lines audio lines, can be attenuated.

(Embodiment 3)

Figure 7:
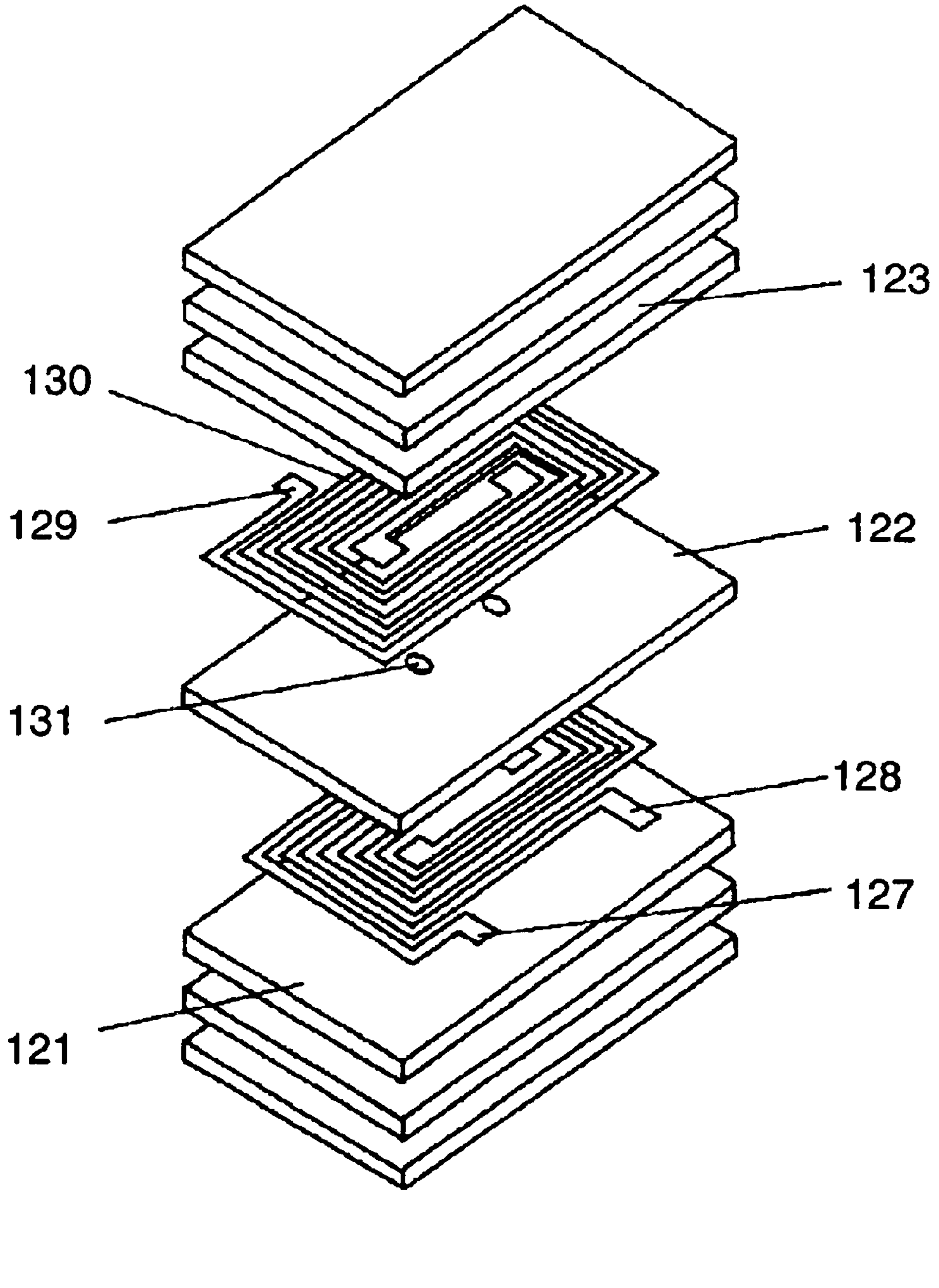
FIG. 7 is an exploded perspective view of a noise filter according to exemplary embodiment 3 of the invention.

FIG. 7 is an exploded perspective view of a noise filter according to exemplary embodiment 3 of the present invention. The noise filter includes a first insulating layer 121, a first conductor 127 having a spiral shape provided on an upper surface of the first insulating layer 121, and a second conductor 128 having a spiral shape provided substantially parallel with the first conductor 127 on the upper surface of the first insulating layer 121. The first conductor 127 and the second conductor 128 are arranged of a double spiral configuration.

The noise filter further includes a second insulating layer 122 provided on the upper surface of the first insulating layer 121, through-holes 131*a* and 131*b* provided in the second insulating layer 122 and filled with electrically conductive material, a third conductor 129 having a spiral shape provided on an upper surface of the second insulating layer 122, and a fourth conductor 140 having a spiral shape provided substantially parallel to the third conductor 129 on the upper surface of the second insulating layer 122. The first conductor 127 and the second conductor 128 are located between the first insulating layer 121 and the second insulating layer 122. The third conductor 129 and the fourth conductor 130 have are arranged in a double spiral configuration. The first conductor 129 is electrically connected via the through-hole 131*a* to the first conductor 127, while the fourth conductor 130 is electrically connected via the through-hole 131*b* to the second conductor 128. The first to fourth conductors 127 to 130 may be fabricated by a printing process or preferably by a plating process forming the spiral shape precisely and accurately.

The second insulating layer 122 has a magnetic permeability not larger than the first insulating layer 121 and a third insulating layer 123.

Figure 8:
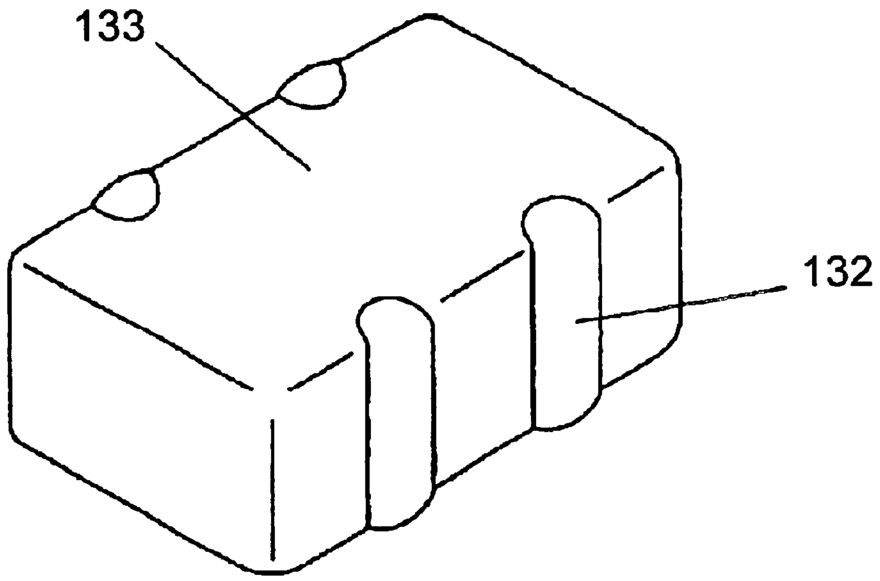
FIG. 8 is a perspective view of the noise filter of embodiment 3.

FIG. 8 is a perspective view of the noise filter of embodiment 3. The noise filter 133 includes four external electrodes 132 electrically connected to the first to fourth conductors 127 to 130, respectively.

In particular, the four conductors 127 to 130 are arranged of spiral shapes. The first conductor 127 and the second conductor 128 extend substantially in parallel with each other, and the third conductor 129 and the fourth conductor 130 extend substantially in parallel with each other. Therefore, the distance between two adjacent conductors of the spiral shape on the insulating layer can be reduced. Also, as the conductors are arranged of spiral shapes, a magnetic path on the insulating layer can be increased. Since the magnetic fluxes generated by the conductors emphasize each other, the filter has a large impedance in a common mode. Additionally, the magnetic permeability of the second insulating layer 122 having the through-holes 131*a* and 131*b* is not larger than that of other insulating layers. In other words, the second insulating layer 122 having the lower magnetic permeability is positioned between the conductors 127 and 128 and between the conductors 129 and 130. This arrangement emphasizes the magnetic field generated by each conductor, thus effectively attenuating a noise in the common mode.

Moreover, as the first insulating layer 121 and the third insulating layer 123 between which the four conductors 127 to 130 are provided have a small magnetic permeability, the filter further attenuates the noise in the common mode.

The insulating layers and the insulating layer having the small magnetic permeability are baked together as a single unit, as shown in FIG. 8. The second insulating layer 122 having the lower permeability may be made of Ni—Zn—Cu—Co ferrite. The second insulating layer 122 may be made of non-magnetic material for further attenuation of noises. The non-magnetic material is preferably selected from forsterite glass, alumina-glass dielectric, and Zn—Cu ferrite.

(Embodiment 4)

Figure 9:
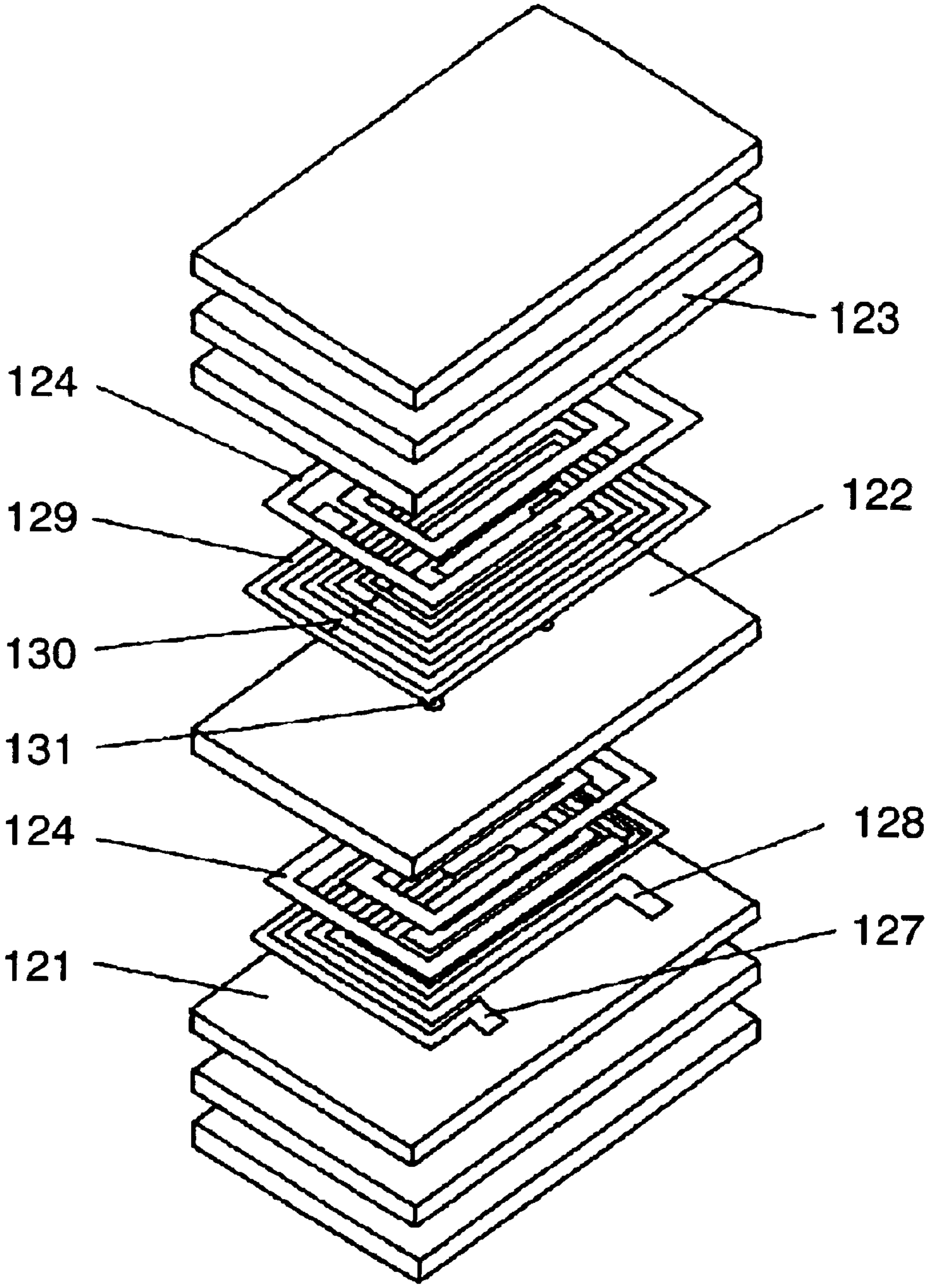
FIG. 9 is an exploded perspective view of a noise filter according to exemplary embodiment 4 of the invention.
Figure 10:
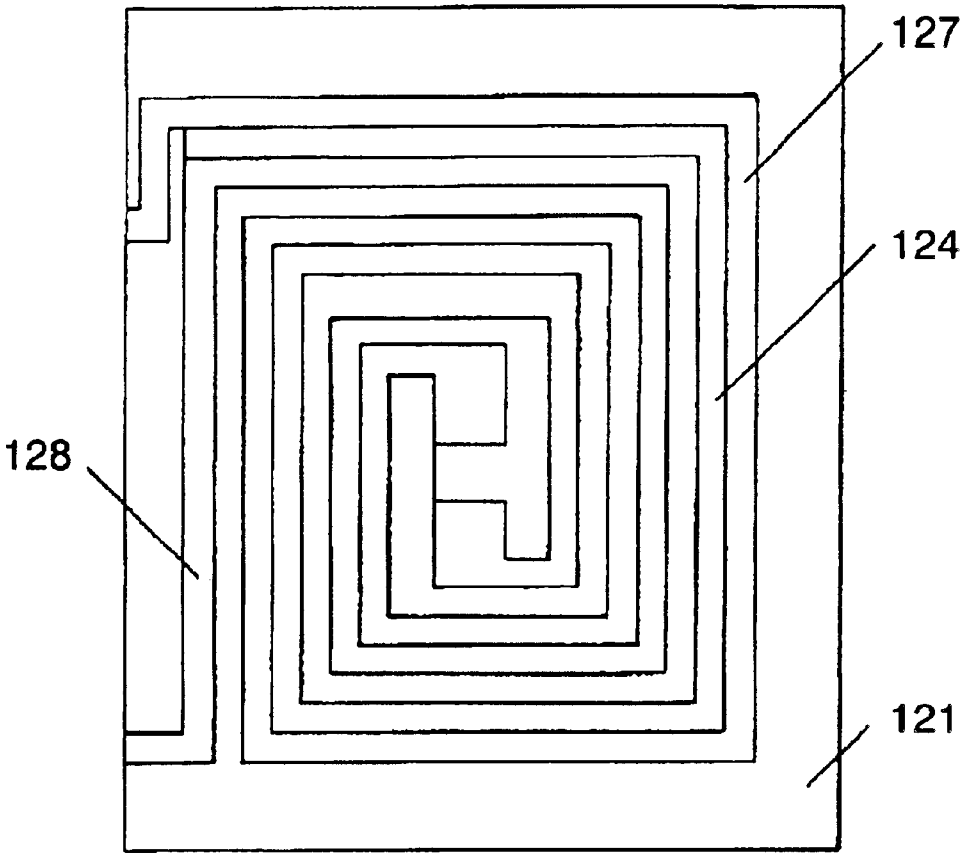
FIG. 10 is a top view of a first insulating layer of the noise filter of embodiment 4.

FIG. 9 is an exploded perspective view of a noise filter according to exemplary embodiment 4 of the present invention. FIG. 10 is a top view of a first insulating layer of the noise filter. In particular, the first insulating layer 121 has a magnetic permeability identical to that of a second insulating layer 122 and a third insulating layer 123. An insulating layer 124 having a small magnetic permeability is provided at least either between a first conductor 127 and a second conductor 128 both patterned by, e.g. a vapor deposition process or between a third conductor 129 and a fourth conductor 130 both patterned by the same process. The magnetic permeability of the insulating layer 124 is not larger than that of the insulating layers 121 to 123. In this embodiment, like components are denoted by like numerals as those of embodiment 3 and will be explained in no more detail.

The first to fourth conductors 127 to 130 are arranged of spiral shapes. The first conductor 127 and the second conductor 128 extend substantially parallel with each other, while the third conductor 129 and the fourth conductor 130 extend substantially parallel with each other. Therefore, the distance between two adjacent conductors of the spiral shapes on the insulating layer can be reduced. Since the conductors are arranged of spiral shapes, a magnetic path on each insulating layer can be increased. Since the magnetic fluxes generated by the conductors emphasize each other, the filter has a large impedance in the common mode. Additionally, the insulating layers 124 having the smaller magnetic permeability are positioned between the conductors 127 and 128 and between the conductors 129 and 130, respectively. This arrangement emphasizes a magnetic flux generated by each conductor, thus effectively attenuating a noise in the common mode.

Moreover, since the first insulating layer 121 and the third insulating layer 123 between which the four conductors 127 to 130 are provided has the small magnetic permeability, the filter attenuates noises more.

Material of the insulating layer 124 having the smaller magnetic permeability may be selected from those described in embodiment 3 with equal effects.

(Embodiment 5)

Figure 11:
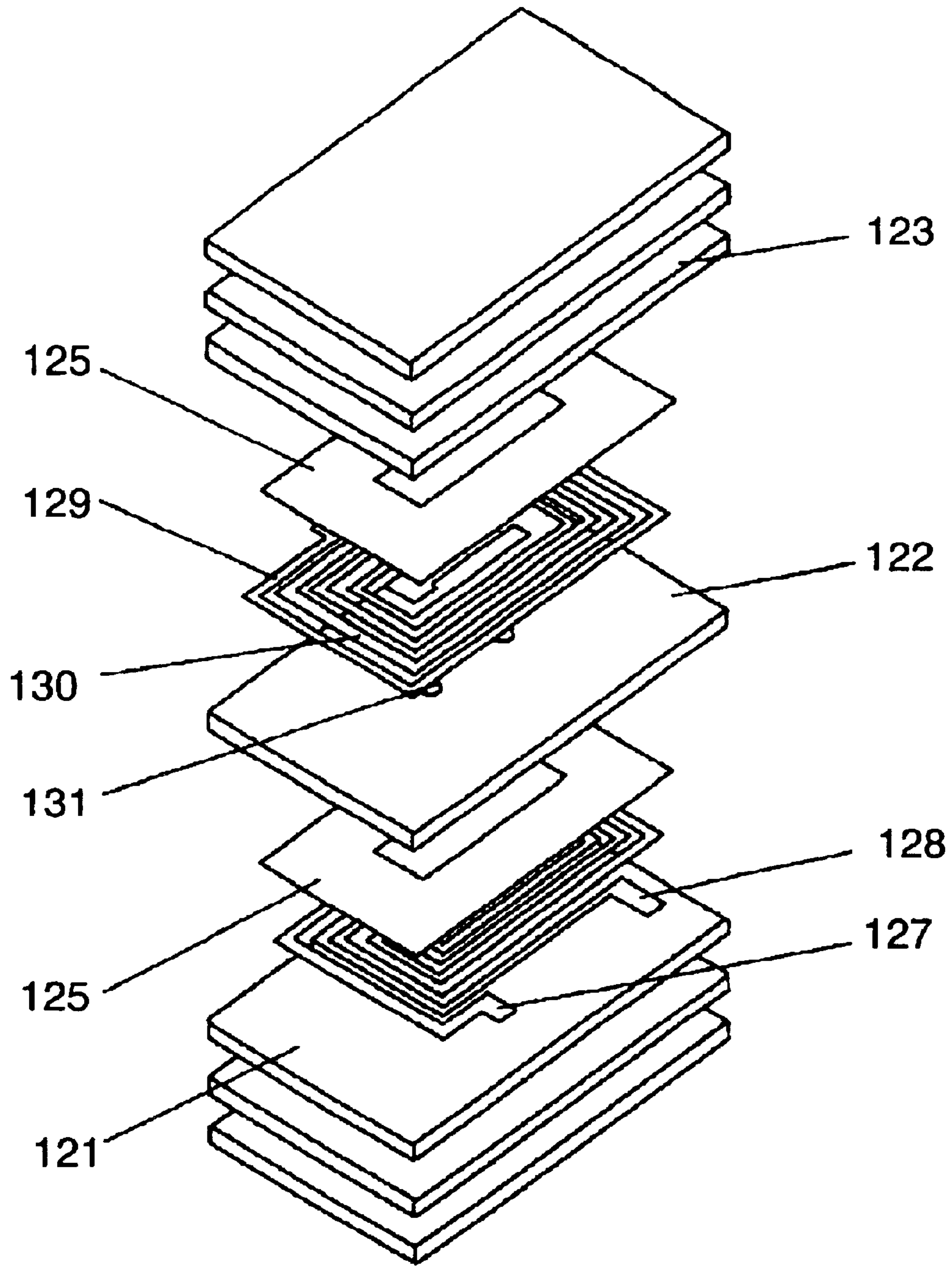
FIG. 11 is an exploded perspective view of a noise filter according to exemplary embodiment 5 of the invention.

FIG. 11 is an exploded perspective view of a noise filter according to exemplary embodiment 5 of the present invention. A magnetic permeability of a second insulating layer 122 is equal to that of a first insulating layer 121 and a third insulating layer 123. A insulating layer 125 having a smaller magnetic permeability is provided over at least either the first conductor 127 and the second conductor 128 both patterned by, e.g. a printing process or the third conductor 129 and the fourth conductor 130 both patterned by the same process. The magnetic permeability of the insulating layer 125 is not larger than that of the insulating layers 121 to 123. In this embodiment, like components are denoted by like numerals as those of embodiment 3 and will be explained in no more detail.

Each of the first to fourth conductors 127 to 130 are arranged of a spiral shape. The first conductor 127 and the second conductor 128 extend substantially parallel with each other, while the third conductor 129 and the fourth conductor 130 extend substantially parallel with each other. Therefore, the distance between two adjacent conductors of the spiral shape on the insulating layer can be reduced. Since the conductors are arranged of spiral shapes, a magnetic path on the insulating layer can be increased. Since the magnetic fluxes generated by the conductors emphasize each other, the filter has a large impedance in a common mode. Additionally, the insulating layer 125 has the magnetic permeability not larger than the other insulating layers. Two of the insulating layers 125 having smaller permeability are positioned between the conductors 127 and 128 and between the conductors 129 and 130, respectively. This arrangement emphasizes a magnetic field generated by the conductors, thus effectively attenuating a noise in the common mode.

Moreover, since the first insulating layer 121 and the third insulating layer 123 between which the four conductors 127 to 130 are provided have a small magnetic permeability, the filter attenuates noises more.

Material of the insulating layer 125 having the smaller magnetic permeability may be selected from those described in embodiment 3 with equal effects.

(Embodiment 6)

Figure 12:
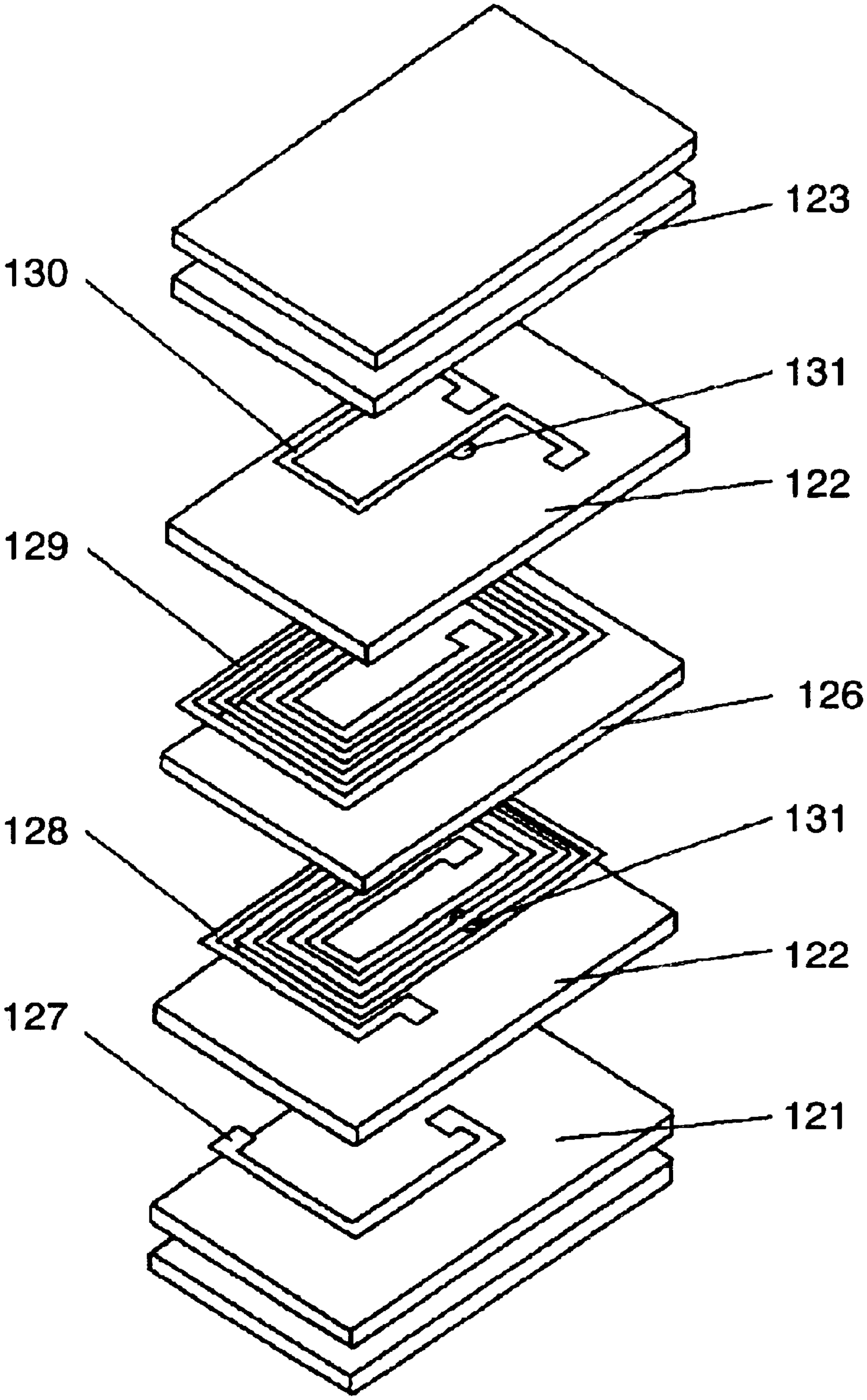
FIG. 12 is an exploded perspective view of a noise filter according to exemplary embodiment 6 of the invention.
Figure 13A:
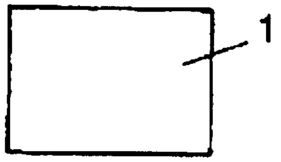
FIGS. 13A to 13G are plan views of a conventional noise filter.
Figure 13B:
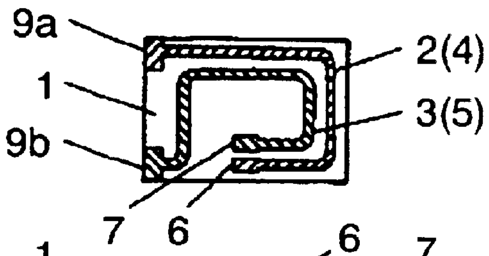
Figure 13C:
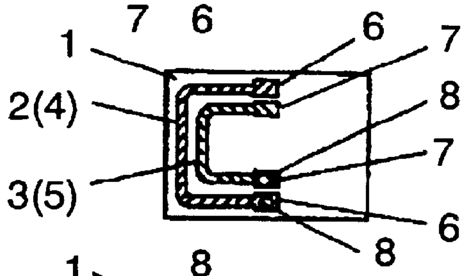
Figure 13D:
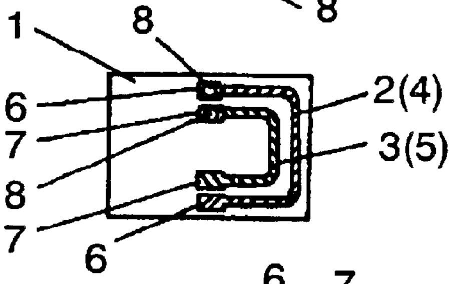
Figure 13E:
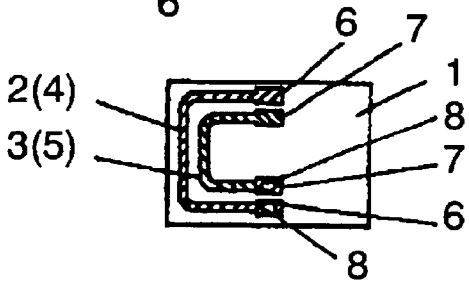
Figure 13F:
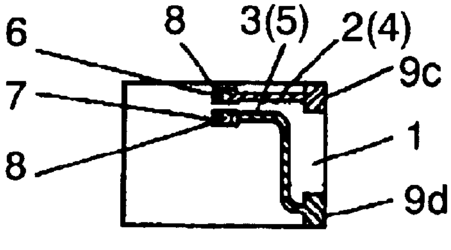
Figure 13G:
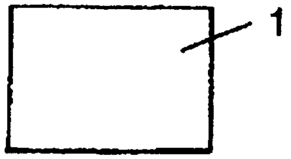
Figure 14:
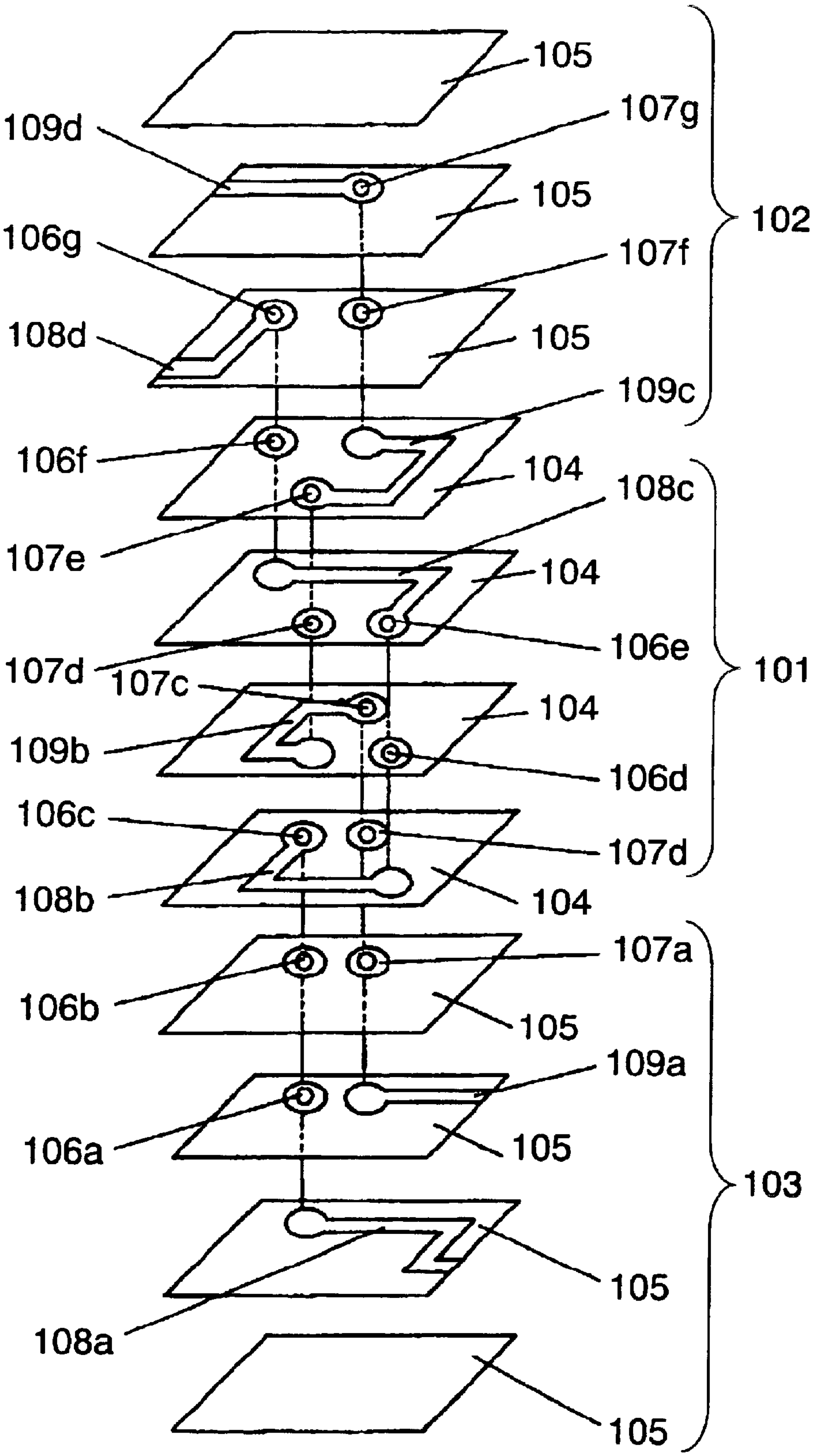
FIG. 14 is an exploded perspective view of the conventional noise filter.

FIG. 12 is an exploded perspective view of a noise filter according to exemplary embodiment 6 of the present invention. A magnetic permeability of a second insulating layer 122 is equal to that of a first insulating layer 121 and a third insulating layer 123. A insulating layer 126 having a small magnetic permeability is provided between the second conductor 128 and the third conductor 129 patterned by e.g. a plating process. The magnetic permeability of the insulating layer 126 is not larger than that of the insulating layers 121 to 123. In this embodiment, like components are denoted by like numerals as those of embodiment 3 and will be explained in no more detail.

The second and third conductors 128 and 129 are arranged in a spiral shape. The magnetic path on the insulating layer can thus be lengthened. This arrangement emphasizes a magnetic field generated by the conductors 128 and 129, hence having a large impedance in a common mode. Additionally, the insulating layer 126 has the magnetic permeability not larger than the other insulating layers. Since the second conductor 128 and the third conductor 129 are positioned to sandwich the insulating layer 126 having the smaller permeability, the filter emphasizes magnetic fluxes generated by the conductors. As the result, a noise in the common mode can effectively be attenuated.

Moreover, since the first insulating layer 121 and the third insulating layer 123 between which the four conductors 127 to 130 are provided have the small magnetic permeability, the filter attenuates noises more. Material of the insulating layer 125 having the smaller magnetic permeability may be selected from those described in embodiment 3 with equal effects.

INDUSTRIAL APPLICABILITY

A noise filter according to the present invention includes a first and second inner conductors which influence each other and are provided on a magnetic sheet, and the conductors can be long. Such magnetic sheets are provided, the first and second inner conductors influencing each other can be longer, thus providing the filter with a large impedance for noises in a common mode.

What is claimed is:

1. A noise filter comprising:

a magnetic body including first and second magnetic sheets;

external electrodes provided on both side surfaces of said magnetic body;

first and second inner conductors having spiral shapes of one or more turns and provided on said first magnetic sheet;

third and fourth inner conductors having spiral shapes of one or more turns and provided on said second magnetic sheet;

lead electrodes provided at one end of said first magnetic sheet for connecting a first end of said first inner conductor to one of said external electrodes and for connecting a first end of said second inner conductor to one of said external electrodes, respectively; and lead electrodes provided at one end of said second magnetic sheet for connecting a first end of said third inner conductor to one of said external electrodes and for connecting a first end of said fourth inner conductor to one of said external electrodes, respectively, wherein said first and second inner conductors are not short-circuited from each other, and said third and fourth inner conductors are not short-circuited from each other, wherein a second end of said first inner conductor is located near a second end of said second inner conductor, and a second end of said third inner conductor is located near a second end of said fourth inner conductor, wherein said second end of said first inner conductor is electrically connected to said second end of said third inner conductor, and wherein said second end of said second inner conductor is electrically connected to said second end of said fourth inner conductor.

2. A noise filter comprising:

a magnetic body including first and second magnetic sheets, a first surface of said first magnetic sheet faces a second surface of said second magnetic sheet;

external electrodes provided on both side surfaces of said magnetic body;

first and second inner conductors having spiral shapes of one or more turns and provided on said first surface of said first magnetic sheet;

lead electrodes provided at one end of said first magnetic sheet for connecting a first end of said first inner conductor to one of said external electrodes and for connecting a first end of said second inner conductor to one of said external electrodes, respectively;

a third inner conductor having a spiral shape provided on a first surface of said second magnetic sheet and connected to said first inner conductor; and a fourth inner conductor having a spiral shape provided on a second surface of said first magnetic sheet and connected to said second inner conductor, wherein said first and second inner conductor are not short-circuited from each other, and a second end of said first inner conductor is located near a second end of said second inner conductor.

3. The noise filter according to claim 2, wherein said first and third inner conductors form a first coil, and wherein said second and fourth inner conductors form a second coil.

4. The noise filter according to claim 2, further comprising a non-magnetic material provided on at least one of a surface of said third inner conductor where said second magnetic sheet is not provided and a surface of said fourth inner conductor where said first magnetic sheet is not provided.

5. The noise filter according to claim 1, wherein said magnetic sheets are impregnated with fluoric silane coupling agent.

6. An electronic device comprising:

a noise filter including a magnetic body including first and second magnetic sheets, external electrodes provided on both side surfaces of said magnetic body, first and second inner conductors having spiral shapes of one or more turns and provided on said first magnetic sheet, third and fourth inner conductors having spiral shapes of one or more turns and provided on said second magnetic sheet, lead electrodes provided at one end of said first magnetic sheet for connecting a first end of said first inner conductor to one of said external electrodes and for connecting a first end of said second inner conductor to one of said external electrodes, respectively, and lead electrodes provided at one end of said second magnetic sheet for connecting a first end of said third inner conductor to one of said external electrodes and for connecting a first end of said fourth inner conductor to one of said external electrodes, respectively, wherein said first and second inner conductors are not short-circuited from each other, and said third and fourth inner conductors are not short-circuited from each other, wherein a second end of said first inner conductor is located near a second end of said second inner conductor, and a second end of said third inner conductor is located near a second end of said fourth inner conductor, wherein said second end of said first inner conductor is electrically connected to said second end of said third inner conductor, and wherein said second end of said second inner conductor is electrically connected to said second end of said fourth inner conductor; and signal lines connected to said external electrodes, respectively.

7. A noise filter comprising:

a first insulating layer;

first and second conductors having spiral shapes and provided on a first surface of said first insulating layer;

a second insulating layer having through-holes provided therein and provided over said first surface of said first insulating layer, a second surface of said second insulating layer facing said first insulating layer;

third and fourth conductors having spiral shapes provided on said first surface of said second insulating layer and electrically connected via said through-holes to said first and second conductors, respectively;

a third insulating layer provided over said third and fourth conductors; and external electrodes connected to respective ends of said first to fourth conductors, wherein said first and second conductors extend substantially parallel to each other, wherein said third and fourth conductors extend substantially parallel to each other, and wherein a magnetic permeability of said second insulating layer is not larger than respective magnetic permeabilities of said first and third insulating layers.

8. The noise filter according to claim 7, wherein said second insulating layer comprises Ni—Zn—Cu—Co ferrite.

9. The noise filter according to claim 7, wherein said second insulating layer comprises material having a small magnetic permeability.

10. The noise filter according to claim 9, wherein said material having said small magnetic permeability is selected from forsterite glass, alumina-glass dielectric, and Zn—Cu ferrite.

11. A noise filter comprising:

a first insulating layer;

first and second conductors having spiral shapes and provided on a first surface of said first insulating layer;

a second insulating layer having through-holes provided therein and provided over said first surface of said first insulating layer, a second surface of said second insulating layer facing said first insulating layer;

third and fourth conductors having spiral shapes provided on a first surface of said second insulating layer and electrically connected via said through-holes to said first and second conductors, respectively;

a third insulating layer provided over said third and fourth conductors;

external electrodes connected to respective ends of said first to fourth conductors; and another insulating layer provided at least one of between said first conductor said second conductor and between said third conductor and said fourth conductor, said another insulating layer having a magnetic permeability not larger than a magnetic permeability of at least one of said first to third insulating layers, wherein said first and third conductors extend substantially parallel to each other, and said second and fourth conductors extend substantially parallel to each other.

12. The noise filter according to claim 11, wherein said another insulating layer comprises Ni—Zn—Cu—Co ferrite.

13. The noise filter according to claim 11, wherein said another insulating layer comprises material having a small magnetic permeability.

14. The noise filter according to claim 13, wherein said material having said small magnetic permeability is selected from forsterite glass, alumina-glass dielectric, and Zn—Cu ferrite.

15. A noise filter comprising:

a first insulating layer;

first and second conductors having spiral shapes and provided on a first surface of said first insulating layer;

a second insulating layer having through-holes provided therein and provided over said first surface of said first insulating layer, a second surface of said second insulating layer facing said first insulating layer;

third and fourth conductors having spiral shapes provided on a first surface of said second insulating layer and electrically connected via said through-holes to said first and second conductors, respectively;

a third insulating layer provided over said first surface of said second conductor;

external electrodes connected to respective ends of said first to fourth conductors; and a fourth insulating layer provided at least one of between said first insulating layer and said second insulating layer and between said second insulating layer and said third insulating layer, said fourth insulating layer having a magnetic permeability not larger than respective magnetic permeabilities of said first to third insulating layers, wherein said first and third conductors extend substantially parallel to each other, and said second and fourth conductors extend substantially parallel to each other.

16. The noise filter according to claim 15, wherein said fourth insulating layer comprises Ni—Zn—Cu—Co ferrite.

17. The noise filter according to claim 15, wherein said fourth insulating layer comprises material having a small magnetic permeability.

18. The noise filter according to claim 17, wherein said material having said small magnetic permeability is selected from forsterite glass, alumina-glass dielectric, and Zn—Cu ferrite.

19. A noise filter comprising:

a first insulating layer;

a first conductor having a spiral shape and provided on a first surface of said first insulating layer;

a second insulating layer having a first through-hole provided therein and provided over said first surface of said first insulating layer, a second surface of said second insulating layer facing said first insulating layer;

a second conductor having a spiral shape provided on a first surface of said second insulating layer and connected via said first through-hole to said first conductor;

a third insulating layer provided over said first surface of said second insulating layer, a second surface of said third insulating later facing said second insulating layer;

a third conductor having a spiral shape and provided on a first surface of said third insulating layer;

a fourth insulating layer having a second through-hole provided therein and provided over said first surface of said third insulating layer, a second surface of said fourth insulating layer facing said third insulating layer;

a fourth conductor having a spiral shape provided on a first surface of said fourth insulating layer and connected via said second through-hole to said third conductor;

a fifth insulating layer provided over a first surface of said fourth insulating layer; and external electrodes connected to respective ends of said first to fourth conductors, wherein said second and third conductors having a winding number greater than respective winding numbers of said first and fourth conductors, and a magnetic permeability of at least one of said second to fourth insulating layers is not larger than magnetic permeabilities of other insulating layers of said first to fourth insulating layers.

20. The noise filter according to claim 19, wherein said at least one insulating layer comprises Ni—Zn—Cu—Co ferrite.

21. The noise filter according to claim 19, wherein said at least one insulating layer comprises material having a small magnetic permeability.

22. The noise filter according to claim 21, wherein said material having said lower magnetic permeability is selected from forsterite glass, alumina-glass dielectric, and Zn—Cu ferrite.

23. The noise filter according to claim 2, wherein said magnetic sheets are impregnated with fluoric silane coupling agent.

* * * * *